(12) United States Patent
Chang et al.

(10) Patent No.: US 11,917,804 B2
(45) Date of Patent: Feb. 27, 2024

(54) MANUFACTURING METHOD OF SRAM DEVICE

(71) Applicant: Powerchip Semiconductor Manufacturing Corporation, Hsinchu (TW)

(72) Inventors: Shou-Zen Chang, Taichung (TW); Yi-Hsung Wei, Taoyuan (TW); Pei-Hsiu Tseng, Tainan (TW); Jia-You Lin, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/945,104

(22) Filed: Sep. 15, 2022

(65) Prior Publication Data

US 2023/0014829 A1  Jan. 19, 2023

Related U.S. Application Data

(62) Division of application No. 16/942,731, filed on Jul. 29, 2020, now Pat. No. 11,488,965.

(30) Foreign Application Priority Data

Apr. 24, 2020 (TW) .................................. 109113856

(51) Int. Cl.
*H10B 10/00* (2023.01)
*H01L 49/02* (2006.01)
(Continued)

(52) U.S. Cl.
CPC ............ *H10B 10/12* (2023.02); *G11C 11/412* (2013.01); *G11C 11/417* (2013.01);
(Continued)

(58) Field of Classification Search
CPC ...... H10B 10/12; H10B 10/00; H10B 10/125; G11C 11/412; G11C 11/417;
(Continued)

(56) References Cited

U.S. PATENT DOCUMENTS

| 10,020,311 B1* | 7/2018 | Li | ........................... H10B 12/50 |
| 2014/0145302 A1* | 5/2014 | Hong | ....................... H01L 28/60 257/532 |

(Continued)

*Primary Examiner* — Ahmed N Sefer
(74) *Attorney, Agent, or Firm* — JCIPRNET

(57) ABSTRACT

A manufacturing method of a SRAM memory device includes forming two transistors on a substrate, forming an inner dielectric layer covering the two transistors, forming contacts in the inner dielectric layer for coupling to source nodes of the two transistors, forming a metal interconnect structure on the inner dielectric layer, wherein a portion of an n-th metal layer of the metal interconnect structure is utilized as a lower metal layer, wherein n≥1. An opening is formed in the metal interconnect structure to expose the lower metal layer, and then a capacitor is formed in the opening. The capacitor includes the lower metal layer, a first electrode layer, a dielectric layer, a second electrode layer, and an upper metal layer from bottom to top. The upper metal layer is a portion of an m-th metal layer of the metal interconnect structure, wherein m≥n+1.

7 Claims, 7 Drawing Sheets

(51) Int. Cl.
*G11C 11/417* (2006.01)
*G11C 11/412* (2006.01)
*H01L 23/522* (2006.01)

(52) U.S. Cl.
CPC .......... *H01L 23/5223* (2013.01); *H01L 28/56* (2013.01); *H01L 28/75* (2013.01); *H01L 28/90* (2013.01); *H10B 10/00* (2023.02); *H10B 10/125* (2023.02)

(58) Field of Classification Search
CPC ..... H01L 23/5223; H01L 28/56; H01L 28/75; H01L 28/90
See application file for complete search history.

(56) References Cited

U.S. PATENT DOCUMENTS

| | | | |
|---|---|---|---|
| 2017/0288012 A1* | 10/2017 | Cheon | H01L 23/5223 |
| 2018/0040365 A1* | 2/2018 | Maki | H01L 21/265 |
| 2020/0235105 A1* | 7/2020 | Sharma | G11C 11/419 |

* cited by examiner

MANUFACTURING METHOD OF SRAM DEVICE

CROSS-REFERENCE TO RELATED APPLICATION

This application is a divisional application of and claims the priority benefit of U.S. patent application Ser. No. 16/942,731, filed on Jul. 29, 2020, now allowed. The prior application Ser. No. 16/942,731 claims the priority benefit of Taiwan application serial no. 109113856, filed on Apr. 24, 2020. The entirety of each of the above-mentioned patent applications is hereby incorporated by reference herein and made a part of this specification.

BACKGROUND OF THE INVENTION

Field of the Invention

The invention relates to a semiconductor memory, and in particular to a manufacturing method of a static random-access memory device.

Description of Related Art

Static random-access memory (SRAM) is a volatile semiconductor memory device. At present, a memory device coupled by two transistors and a capacitor is developed. In such a memory device, the capacitor is used as a storage component. Therefore, how to increase the capacitance of the capacitor to improve the electrical performance of the memory device is currently an object of continuous efforts in the industry.

SUMMARY OF THE INVENTION

The invention provides a manufacturing method of a static random-access memory device that may manufacture a static random-access memory device having high capacitance without additional photomasks and manufacturing processes.

In a manufacturing method of a static random-access memory device of the invention, a substrate is provided, and then a first transistor and a second transistor are formed on the substrate, wherein the first transistor includes a first gate, a first source node, and a first drain node, and the second transistor includes a second gate, a second source node, and a second drain node. An inner dielectric layer covering the first and second transistors is formed, and a plurality of contacts coupled to the first source node and the second source node are formed in the inner dielectric layer. A metal interconnect structure is formed on the inner dielectric layer, wherein the metal interconnect structure includes a plurality of metal layers, a plurality of interlayer dielectric (ILD) layers, and a plurality of vias connected to different layers of the plurality of metal layers. A portion of an n-th metal layer of the plurality of metal layers is utilized as a lower metal layer, wherein n≥1. An opening is formed in the metal interconnect structure, wherein a bottom of the opening exposes the lower metal layer. Then, a capacitor is formed in the opening, wherein the capacitor includes the lower metal layer, a first electrode layer formed at a surface of the opening, a dielectric layer formed at a surface of the first electrode layer, a second electrode layer completely filling the opening and covering the dielectric layer, and an upper metal layer formed at a surface of the second electrode layer, and the upper metal layer is a portion of an m-th metal layer of the plurality of metal layers, wherein m≥n+1.

In an embodiment of the invention, the step of forming the opening includes forming a plurality of mask layers above the metal interconnect structure and forming a patterned photoresist layer on the plurality of mask layers, wherein the patterned photoresist layer has a pattern aligned with the lower metal layer. Then, using the patterned photoresist layer as a mask, the pattern is transferred to the plurality of mask layers, and then using the plurality of mask layers as a mask, the pattern is transferred to the metal interconnect structure. Then, the patterned photoresist layer and the plurality of mask layers are removed.

In an embodiment of the invention, a method of forming the first electrode layer includes metal-organic chemical vapor deposition (MOCVD).

In an embodiment of the invention, a method of forming the second electrode layer includes supercritical fluid deposition (SFD), physical vapor deposition (PVD), or a combination thereof.

In an embodiment of the invention, the step of forming the above capacitor includes sequentially depositing the first electrode layer, the dielectric layer, and the second electrode layer on the metal interconnect structure and the lower metal layer in the opening, patterning each of the above layers, and then forming the upper metal layer on the second electrode layer.

In an embodiment of the invention, the step of patterning the second electrode layer, the dielectric layer, and the first electrode layer includes keeping a portion of the second electrode layer, a portion of the dielectric layer, and a portion of the first electrode layer outside the opening to form an extending portion of the capacitor.

In an embodiment of the invention, a material of the dielectric layer includes a high-k material.

Based on the above, the capacitor of the invention is formed in a metal interconnect structure. Therefore, a height thereof is the same as a total thickness of at least one metal layer and at least one via in the metal interconnect structure, and is therefore significantly greater than a surface area of a capacitor traditionally formed on a substrate and close to a thickness of the inner dielectric layer. As a result, the capacitance may be increased. In addition, because the coupling between the capacitor and the transistor is done via the lower metal layer, compared with the traditional capacitor process directly in contact with the source node, the process conditions of the invention are more relaxed and may be integrated into an existing 2-transistor-static random-access memory (2T-SRAM) process. In addition, because the position of the capacitor is moved to the metal interconnect structure, there is room for metal word lines connected to the gate, thereby reducing impedance and avoiding shifting to the power supply capacity of the gate.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
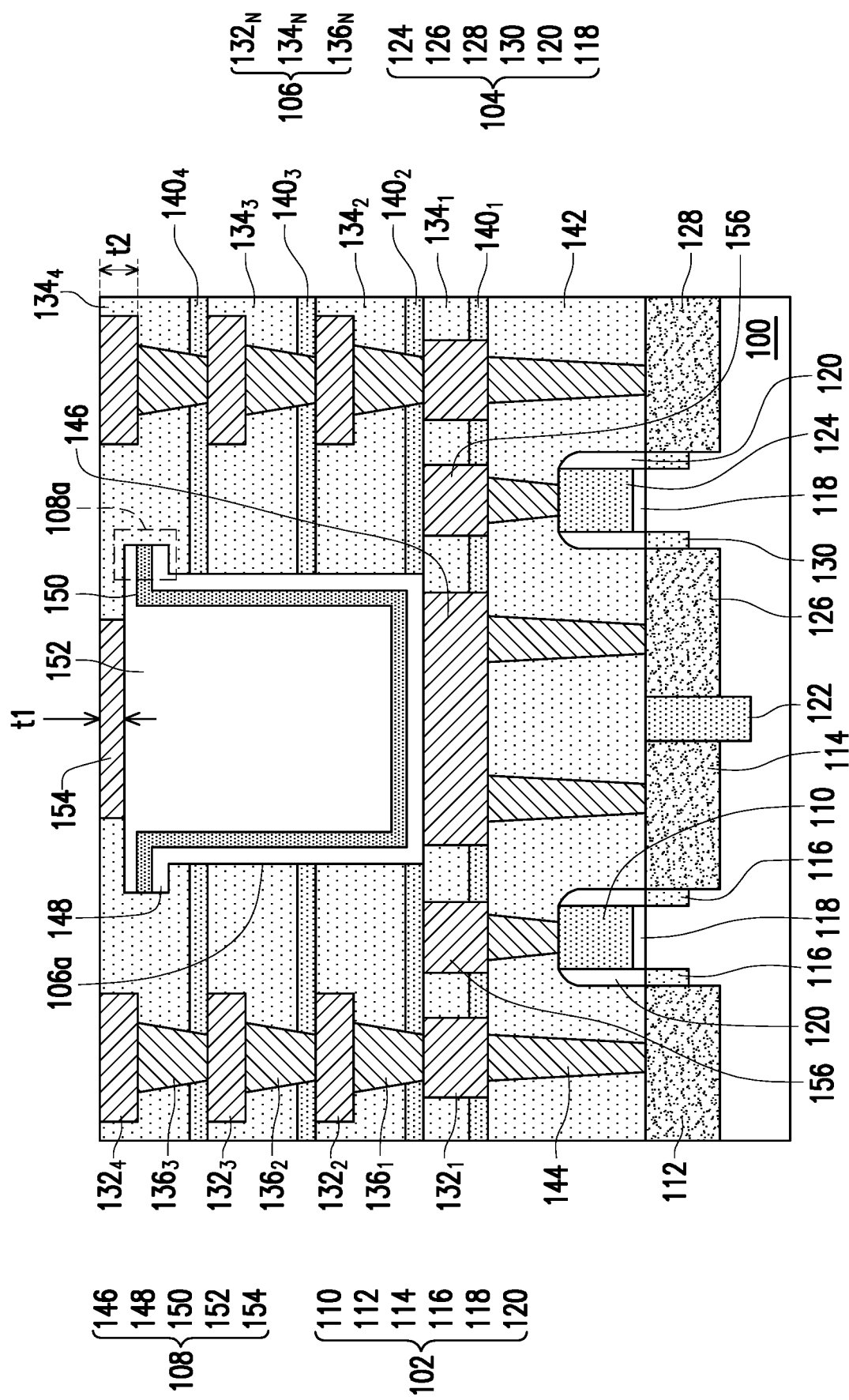
FIG. 1 is a cross-sectional view of a static random-access memory device according to the first embodiment of the invention.

Some embodiments are provided hereinafter and described in detail with reference to figures. However, the embodiments provided are not intended to limit the scope of the invention. In addition, the figures are for illustration purposes only, and are not drawn according to the original size. For example, the thickness of each layer is not drawn according to the actual scale. For ease of explanation, the same devices below are provided with the same reference numerals. Moreover, terms such as "contain", "include", and "have" used in the specification are all open terms, i.e., contains, but not limited to. Moreover, directional terms used in the specification such as "up" and "down" are only directions used in the figures. Therefore, the directional terms are used to illustrate and are not intended to limit the invention.

FIG. 1 is a cross-sectional view of a static random-access memory device according to the first embodiment of the invention.

Referring to FIG. 1, the static random-access memory device of the first embodiment includes a substrate 100, a first transistor 102, a second transistor 104, a metal interconnect structure 106, and a capacitor 108. The first transistor 102 is formed on the substrate 100, wherein the first transistor 102 includes a first gate 110, a first drain node 112, and a first source node 114. In addition, the first transistor 102 may also have LDD (lightly-doped drain) regions 116, a gate dielectric layer 118, and spacers 120. However, the invention is not limited thereto. In an embodiment, the surface of the first drain node 112 and the surface of the first source node 114 may also be provided with a metal silicide layer (not shown) to reduce the resistance of subsequent circuits; and the spacers 120 may be single-layer or multi-layer structures. The second transistor 104 is also formed on the substrate 100 and may be separated from the first transistor 102 by a device isolation structure 122 (such as STI). In the present embodiment, the first transistor 102 and the second transistor 104 are one and the other of an N-type metal oxide semiconductor (NMOS) transistor and a P-type metal oxide semiconductor (PMOS) transistor, respectively. The second transistor 104 includes a second gate 124, a second source node 126, and a second drain node 128. In addition, the second transistor 104 may also have structures such as LDD regions 130, a gate dielectric layer 118, and spacers 120. However, the invention is not limited thereto. In an embodiment, the surfaces of the second source node 126 and the second drain node 128 may also be provided with a metal silicide layer (not shown). In the present embodiment, the first gate 110 and the second gate 124 are combined into a transmission gate. The metal interconnect structure 106 is formed on the first transistor 102 and the second transistor 104, wherein the metal interconnect structure 106 includes a plurality of metal layers $132_N$, a plurality of interlayer dielectric (ILD) layers $134_N$, and a plurality of vias $136_N$ connected to the different metal layers $132_N$. N is an integer of 1 or more. Taking FIG. 1 as an example, the metal interconnect structure 106 includes four metal layers $132_{1\ to\ 4}$, four ILD layers $134_{1\ to\ 4}$, and a plurality of vias $136_{1\ to\ 3}$ connected to different metal layers $132_{1\ to\ 3}$, and other intermediate layers $140_{1\ to\ 4}$ of different materials may be provided between the ILD layers $134_{1\ to\ 4}$ to facilitate the control of the manufacturing process. For example, the material of the ILD layers $134_{1\ to\ 4}$ is SiCO, and the material of the intermediate layers $140_{1\ to\ 4}$ is SiCN. However, the invention is not limited thereto. In addition, there is usually an inner dielectric layer 142 and contacts 144 between the first and second transistors 102 and 104 and the metal interconnect structure 106 to connect the two.

Referring further to FIG. 1, the capacitor 108 is disposed in the metal interconnect structure 106 and coupled between the first transistor 102 and the second transistor 104. For example, the metal interconnect structure 106 has an opening 106a, and the capacitor 108 is formed in the opening 106a. The capacitor 108 includes a lower metal layer 146, a first electrode layer 148, a dielectric layer 150, a second electrode layer 152, and an upper metal layer 154, and is a metal-insulator-metal (MIM) capacitor. The lower metal layer 146 may be coupled to the first source node 114 and the second source node 126 via the contacts 144, and the lower metal layer 146 may be formed of the same material as an n-th metal layer $132_n$ in the metal interconnect structure 106 (n≥1). The upper metal layer 154 is disposed on the lower metal layer 146, and the upper metal layer 154 may be formed of the same material as an m-th metal layer $132_m$ in the metal interconnect structure 106 (m≥n+1). The first electrode layer 148 is disposed between the lower metal layer 146 and the upper metal layer 154, the second electrode layer 152 is disposed between the upper metal layer 154 and the first electrode layer 148, and the dielectric layer 150 is interposed between the first electrode layer 148 and the second electrode layer 152. Taking FIG. 1 as an example, the lower metal layer 146 and the first metal layer $132_1$ are formed of the same material, and therefore may be integrated into the back end of line (BEOL) of an existing 2 transistor-static random-access memory (2T-SRAM) process without the need for additional photomasks and processes. The upper metal layer 154 and the fourth metal layer $132_4$ are formed of the same material, and due to the manufacturing process, a thickness t1 of the upper metal layer 154 is less than a thickness t2 of the fourth metal layer $132_4$, but the invention is not limited thereto. It may be seen from FIG. 1 that the height of the storage capacity of the capacitor 108 is the same as the total thickness of two metal layers $132_{2\ to\ 3}$ and three layers of the vias $136_{1\ to\ 3}$ in the metal interconnect structure 106, which is significantly greater than the surface area of the capacitor traditionally formed on the substrate 100 and close to the thickness of the inner dielectric layer 142. As a result, the capacitance thereof may be increased.

In the present embodiment, the first electrode layer 148 is formed at the surface of the opening 106a, the dielectric layer 150 is formed at the surface of the first electrode layer 148, and the second electrode layer 152 completely fills the opening 106a and covers the dielectric layer 150, wherein the material of the first electrode layer 148 is, for example, Ti, TiN, Ta, TaN, Al, In, Nb, Hf, Sn, Zn, Zr, Cu, Y, or a combination thereof. The material of the dielectric layer 150 is, for example, a high-k material, silicon oxide, silicon nitride, silicon oxide/silicon nitride/silicon oxide (ONO), or a combination thereof; the high-k material is, for example, tantalum oxide ($Ta_2O_5$), aluminum oxide ($Al_2O_3$), hafnium oxide ($HfO_2$), titanium oxide ($TiO_2$), zirconium oxide ($ZrO_2$), or a combination thereof. The material of the second electrode layer 152 is, for example, Ti, TiN, Ta, TaN, Al, In, Nb, Hf, Sn, Zn, Zr, Cu, Y, or a combination thereof. In the present embodiment, the capacitor 108 also has an extending portion 108a extended outside the opening 106a to further increase the capacitance of the capacitor 108.

In FIG. 1, a plurality of word lines (WL) 156 are also disposed to be coupled to the first gate 110 and the second gate 124, respectively, and the word lines 156 and the lower metal layer 146 and the first metal layer $132_1$ are all formed of the same material. In addition, since FIG. 1 shows a cross section of the device, even if not visible, the extending direction of the word lines 156 may actually be the same as the extending direction of the first gate 110/the second gate 124. This is because the position of the capacitor 108 is moved to the metal interconnect structure 106, so there is room for the metal word lines 156 connected to the gates (110/124) to reduce the impedance of the lower electrode of the conventional capacitor in direct contact with the first source node 114 and the second source node 126, thereby avoiding the issues of shifting to the power supply capacity of the gate and capacitor leakage.

Figure 2A:
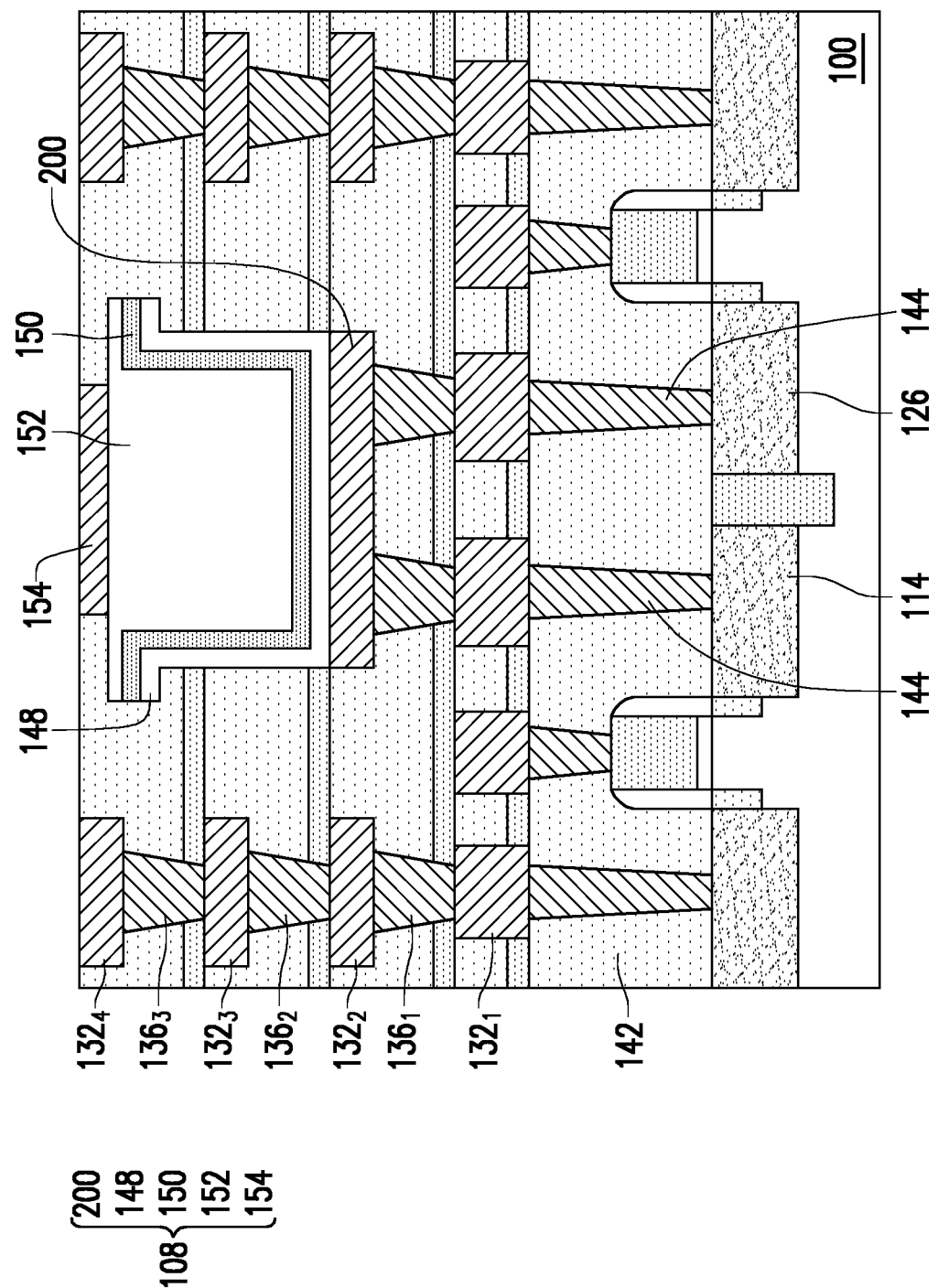
FIG. 2A and FIG. 2B are cross-sectional views of two examples of the static random-access memory device of the first embodiment.
Figure 2B:
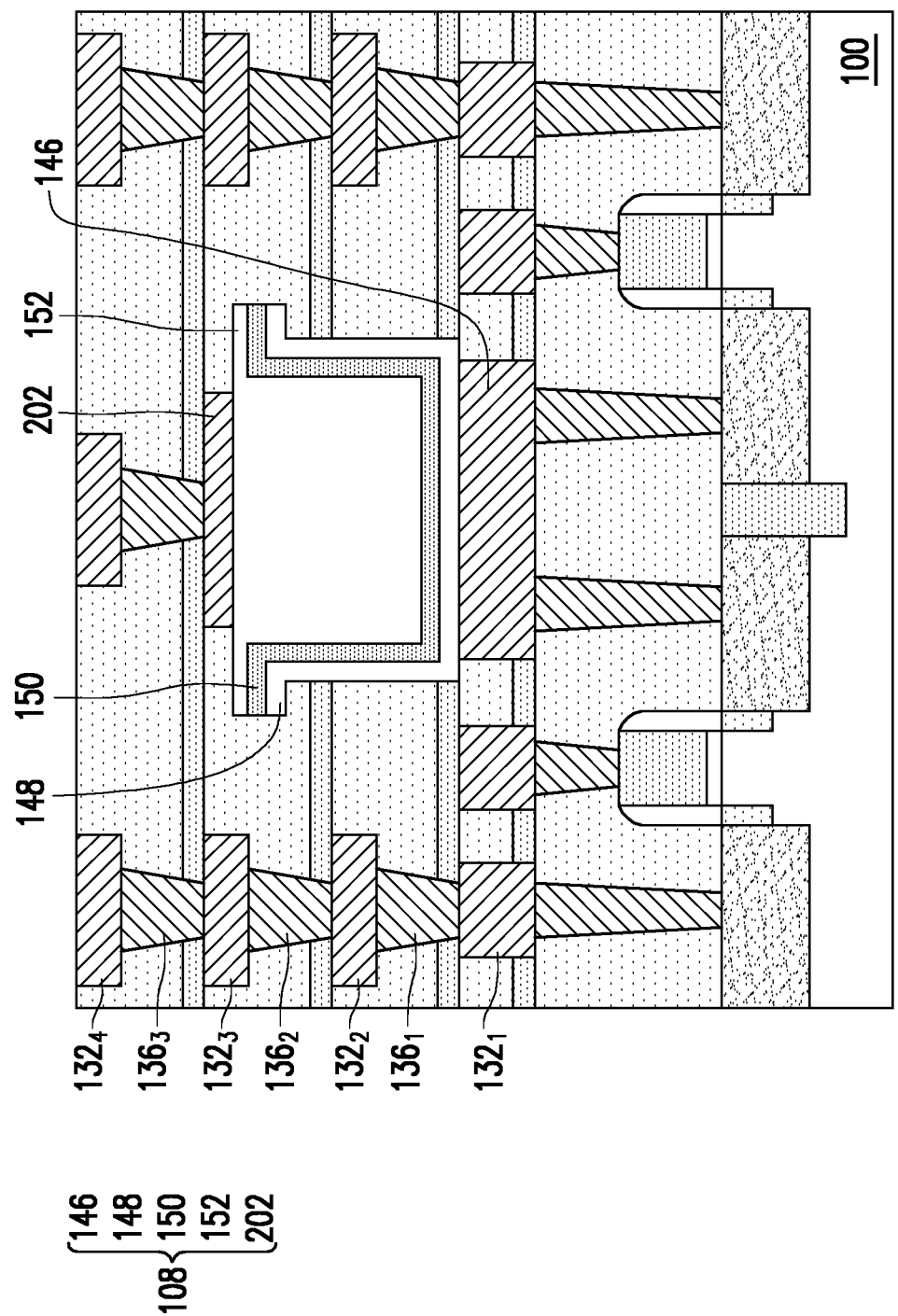

FIG. 2A and FIG. 2B are cross-sectional views of two examples of the static random-access memory device of the first embodiment, wherein the same reference numerals as in the previous embodiment are used to indicate the same or similar components, and the same or similar components are also as provided in the previous embodiment, and are not repeated herein.

In FIG. 2A, a lower metal layer 200 of the capacitor 108 and the second metal layer $132_2$ in the metal interconnect structure 106 are formed of the same material, and the remaining components are the same as those in FIG. 1. Therefore, the lower metal layer 200 of the capacitor 108 is coupled to the first source node 114 and the second source node 126 via the contacts 144, the metal layer $132_1$, and the via $136_1$. It may be seen from FIG. 2A that the height of the storage capacity of the capacitor 108 is the same as the total thickness of one metal layer $132_3$ and two layers of the vias $136_{2\ to\ 3}$ in the metal interconnect structure 106, and therefore the surface area of the capacitor 108 is still greater than the surface area of the capacitor traditionally formed on the substrate 100 and close to the thickness of the inner dielectric layer 142. As a result, the capacitance thereof may be increased. For example, the thickness of the inner dielectric layer 142 is 0.28 µm, and the total thickness of the one metal layer $132_3$ and the two layers of the vias $136_{2\ to\ 3}$ above is approximately 0.49 µm or more, so the capacitance is increased by at least 64%.

In FIG. 2B, an upper metal layer 202 of the capacitor 108 and the third metal layer $132_3$ in the metal interconnect structure 106 are formed of the same material, and the remaining components are the same as those in FIG. 1. It may be seen from FIG. 2B that the height of the storage capacity of the capacitor 108 is the same as the total thickness of one metal layer $132_2$ and two layers of the vias $136_{1\ to\ 2}$ in the metal interconnect structure 106, and therefore the surface area of the capacitor 108 is still greater than the surface area of the capacitor traditionally close to the thickness of the inner dielectric layer 142. As a result, the capacitance thereof may be increased.

FIG. 3A to FIG. 3G are diagrams of a manufacturing process of a static random-access memory device according to the second embodiment of the invention.

Figure 3A:
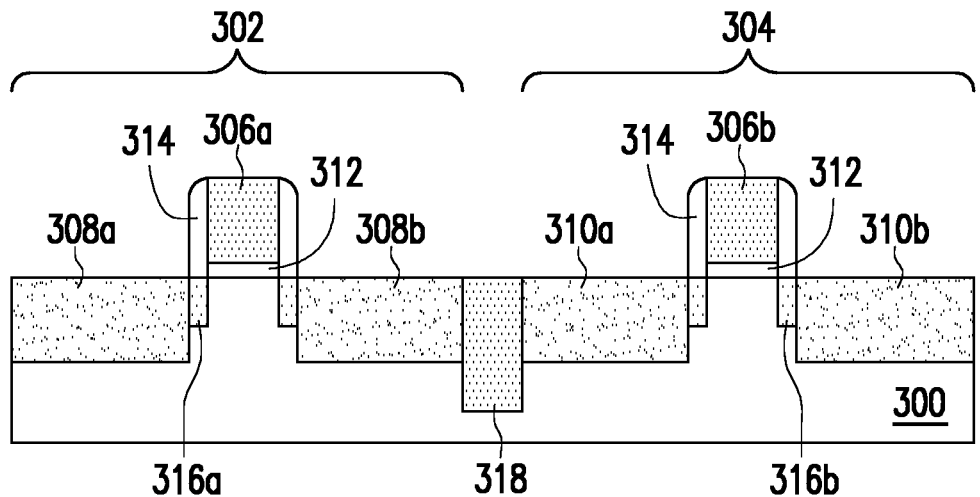
FIG. 3A to FIG. 3G are diagrams of a manufacturing process of a static random-access memory device according to the second embodiment of the invention.

Please refer to FIG. 3A first. A substrate 300 is provided, and then a first transistor 302 and a second transistor 304 are formed, wherein the first transistor 302 includes a first gate 306a, a first drain node 308a, and a first source node 308b, and the second transistor 304 includes a second gate 306b, a second source node 310a, and a second drain node 310b. The manufacturing processes of the first transistor 302 and the second transistor 304 are as provided in the prior art, and therefore components such as a gate dielectric layer 312, spacers 314, and LDD regions 316a and 316b may also be formed in the first transistor 302 and the second transistor 304. For example, the gate dielectric layer 312 and a conductive layer (not shown) may be formed at the surface of the substrate 300 having a device isolation structure 318 (such as STI) in sequence, and then the gate dielectric layer 312 and the first gate 306a and the second gate 306b may be defined, and the LDD regions 316a and 316b are first formed in the substrate 300 via an ion implantation process, and then the spacers 314 are formed at the sidewalls of the first gate 306a and the second gate 306b. Then, since the first transistor 302 and the second transistor 304 are one and the other of an N-type metal oxide semiconductor transistor and a P-type metal oxide semiconductor transistor, respectively, the first drain node 308a and the first source node 308b and the second source node 310a and the second drain node 310b of different conductivity types are respectively formed using an ion implantation process. In addition, a metal silicide layer (not shown) may be formed at the surfaces of the first drain node 308a and the first source node 308b and the second source node 310a and the second drain node 310b to facilitate subsequent electrical coupling. The above process is only one example that may be implemented, and may be changed accordingly according to the components contained in the transistor, and is not limited to the above steps and processes.

Figure 3B:
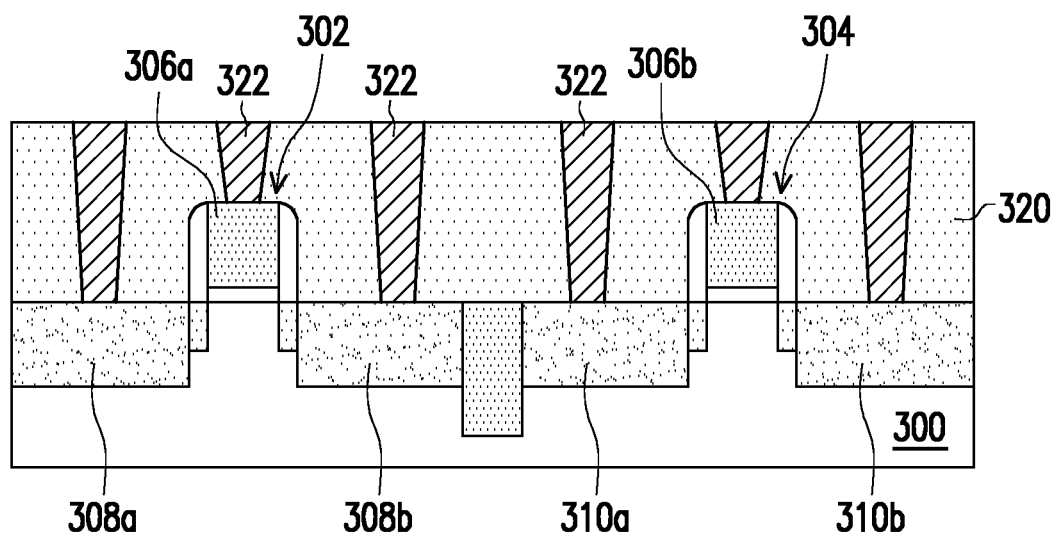

Then, referring to FIG. 3B, an inner dielectric layer 320 covering the first and second transistors 302 and 304 is formed, and contacts 322 coupled to the first source node 308b and the second source node 310a are formed in the inner dielectric layer 320. The material of the inner dielectric layer 320 is, for example, silicon oxide formed by chemical vapor deposition of tetraethoxysilane (TEOS) as a reactive gas, or selected from borophosphosilicate glass (BPSG), phosphorus-doped silicon glass (PSG), low-k materials, etc. In the present embodiment, the resulting contacts 322 may also serve as contacts connected to the first gate 306a, the second gate 306b, the first drain node 308a, and the second drain node 310b individually.

Figure 3C:
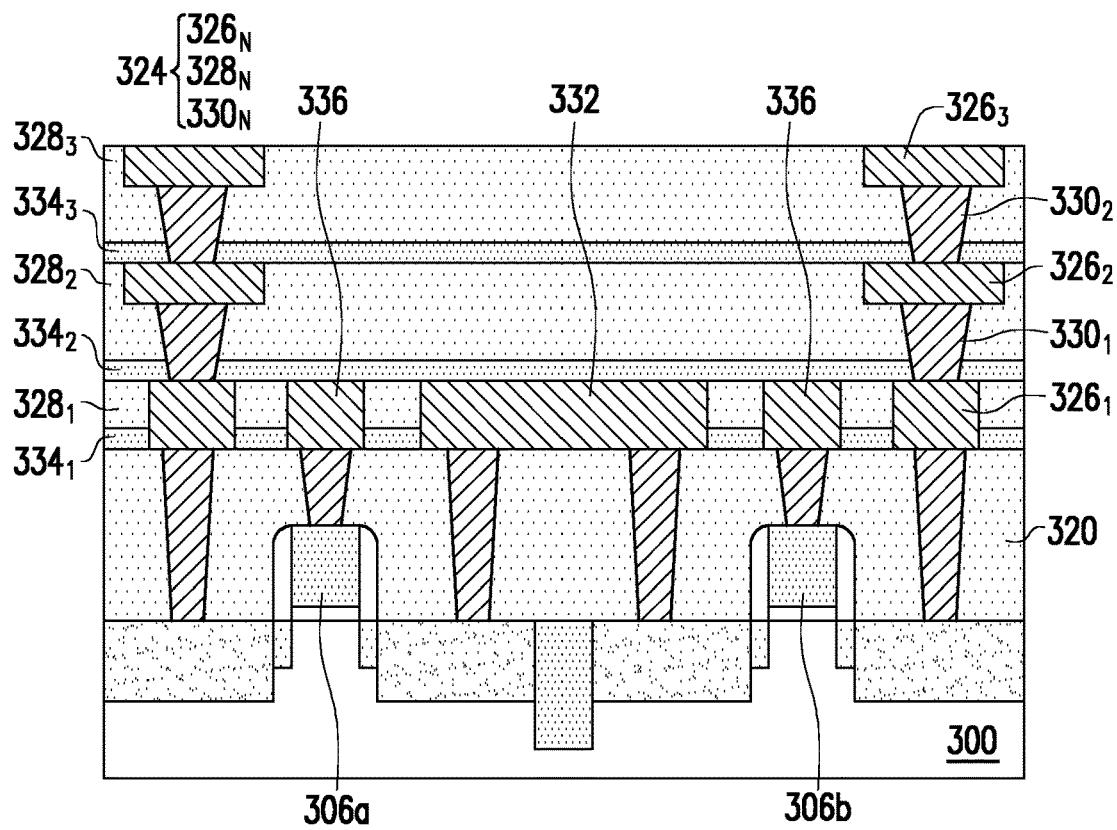

Next, referring to FIG. 3C, a metal interconnect structure 324 is formed on the inner dielectric layer 320, including a plurality of metal layers $326_N$, a plurality of interlayer dielectric (ILD) layers 328N, and a plurality of vias 330N connected to the different metal layers $326_N$, wherein N is an integer of 1 or more. In the process of manufacturing the metal interconnect structure 324, the lower metal layer 332 of the capacitor may be completed first, which may be manufactured together with the n-th metal layer $326_N$ (wherein n≥1). FIG. 3C shows that the lower metal layer 332 is manufactured together with the first metal layer $326_1$, so the lower metal layer 332 is a portion of the first metal layer $326_1$. In another embodiment, the lower metal layer 332 may also be manufactured together with the second metal layer 3262 to obtain a capacitor as shown in FIG. 2A, and so on. In addition, other intermediate layers $334_{1\ to\ 3}$ with different materials may be provided between the ILD layers $328_{1\ to\ 3}$ to facilitate the control of the manufacturing process, and the materials thereof are as provided in the above embodiments, and are therefore not repeated herein. Moreover, when the metal layer $326_1$ is manufactured, word lines (WL) 336 may also be formed, which are respectively coupled to the first gate 306a and the second gate 306b. Since the word lines 336 connected to the first gate 306a and the second gate 306b are metal, the impedance may be reduced to avoid shifting to the power supply capacity of the gate.

Figure 3D:
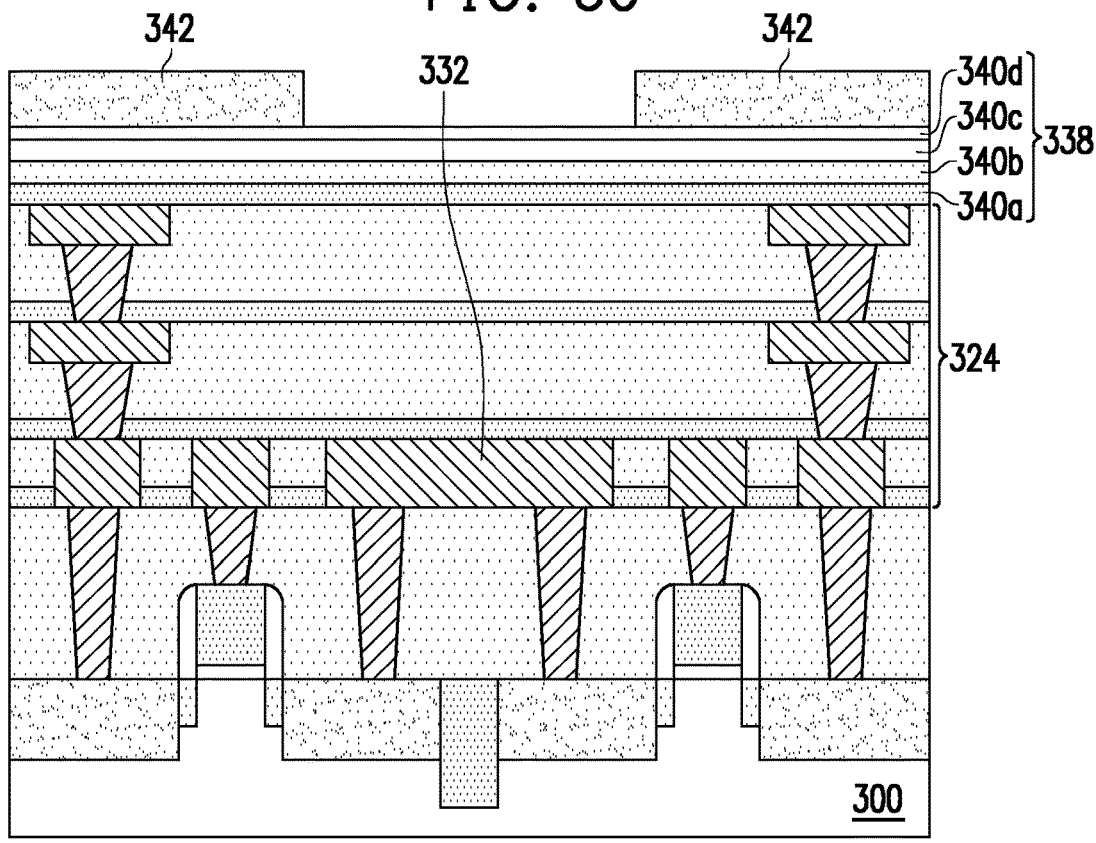

Then, referring to FIG. 3D, in order to form an opening capable of accommodating the capacitor, a plurality of mask layers 338 may be first formed above the metal interconnect structure 324, which may include film layers of different materials to facilitate subsequent etching of the opening. In an embodiment, the plurality of mask layers 338 include one SiCN layer 340a, one SiCO layer 340b, one amorphous carbon (a-C) layer 340c, and a plurality of photoresist (MLR) SiON layers 340d. However, the invention is not limited thereto. Subsequently, a patterned photoresist layer 342 is formed on the plurality of mask layers 338, wherein the patterned photoresist layer 342 has a pattern aligned with the lower metal layer 332.

Figure 3E:
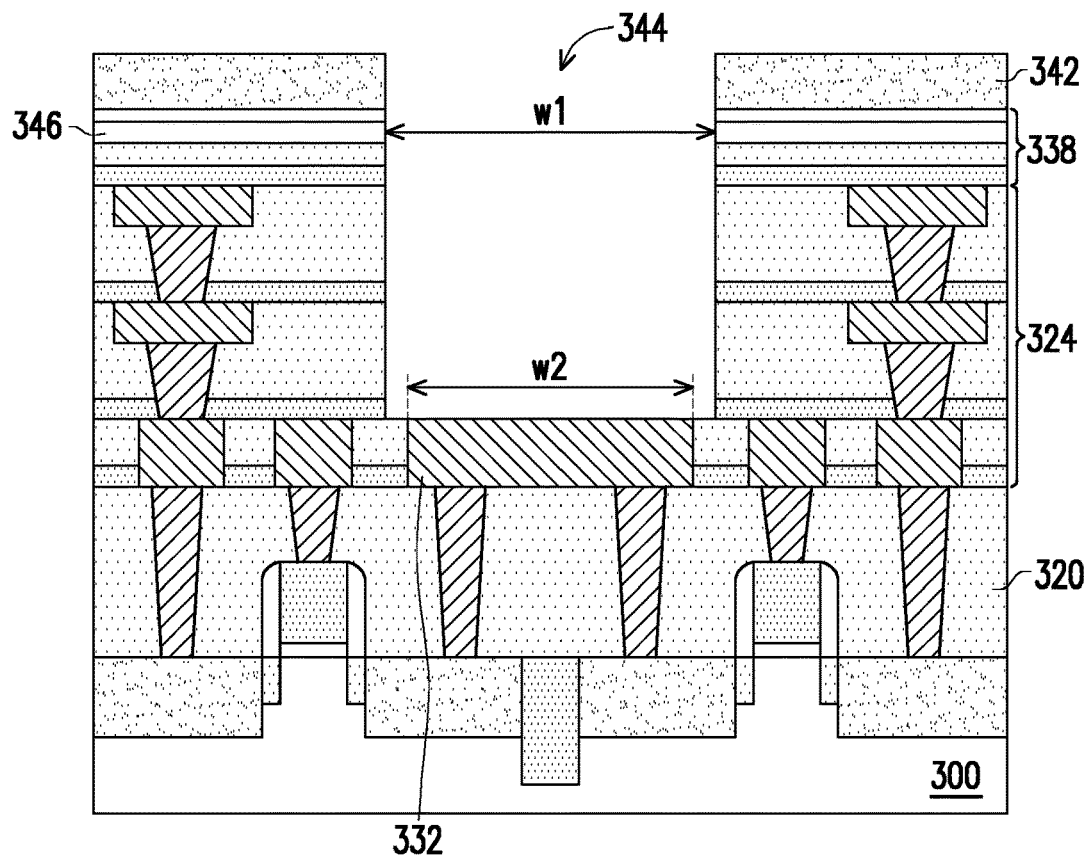

Next, referring to FIG. 3E, the patterned photoresist layer 342 is used as a mask, and the pattern is transferred to the plurality of mask layers 338, and then the plurality of mask layers 338 are used as a mask, and the pattern is transferred to the metal interconnect structure 324 to form an opening 344, wherein the bottom of the opening 334 exposes the lower metal layer 332. In the present embodiment, a width w1 of the opening 344 is slightly greater than a width w2 of the lower metal layer 332, but the invention is not limited thereto. In another embodiment, the width w1 of the opening 344 may be equal to or less than the width w2 of the lower metal layer 332.

Figure 3F:
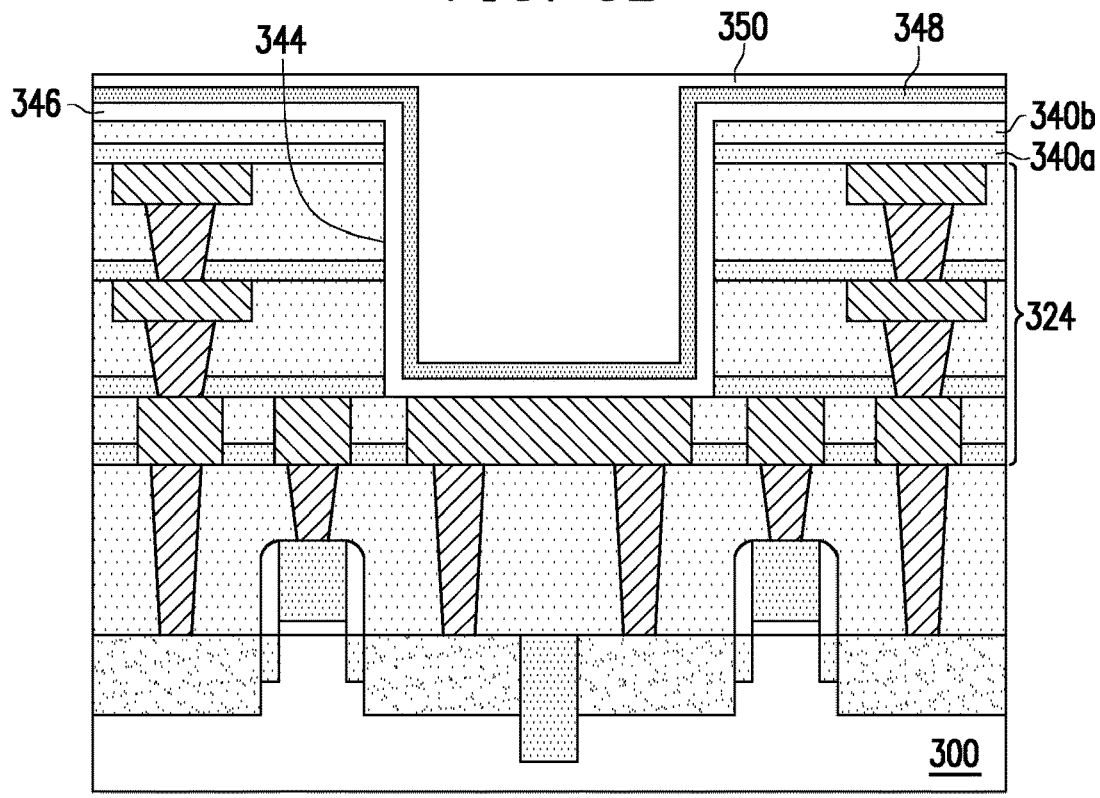

Next, referring to FIG. 3F, the patterned photoresist layer (342 in FIG. 3E) and the plurality of mask layers (338 in FIG. 3E) are removed, or a portion of the materials such as the SiCN layer 340a and the SiCO layer 340b may be kept. Then, in order to form a capacitor in the opening 344, a first electrode layer 346 is first deposited on the metal interconnect structure 324 and the lower metal layer 322. The method of forming the first electrode layer 346 is, for example, chemical vapor deposition (CVD), physical vapor deposition (PVD), or a combination thereof, such as metal-organic vapor deposition (MOCVD). Then, a dielectric layer 348 and a second electrode layer 350 are deposited, wherein the method of forming the second electrode layer 350 is, for example, supercritical fluid deposition (SFD), physical vapor deposition (PVD), or a combination thereof. Moreover, since the aspect ratio of the opening 344 is greater, SFD is preferably first performed to deposit a portion of the second electrode layer, and then the remaining second electrode layer is deposited using PVD. Suitable materials of the first electrode layer 346, the dielectric layer 348, and the second electrode layer 350 are provided in the above embodiments, and are therefore not repeated herein.

Figure 3G:
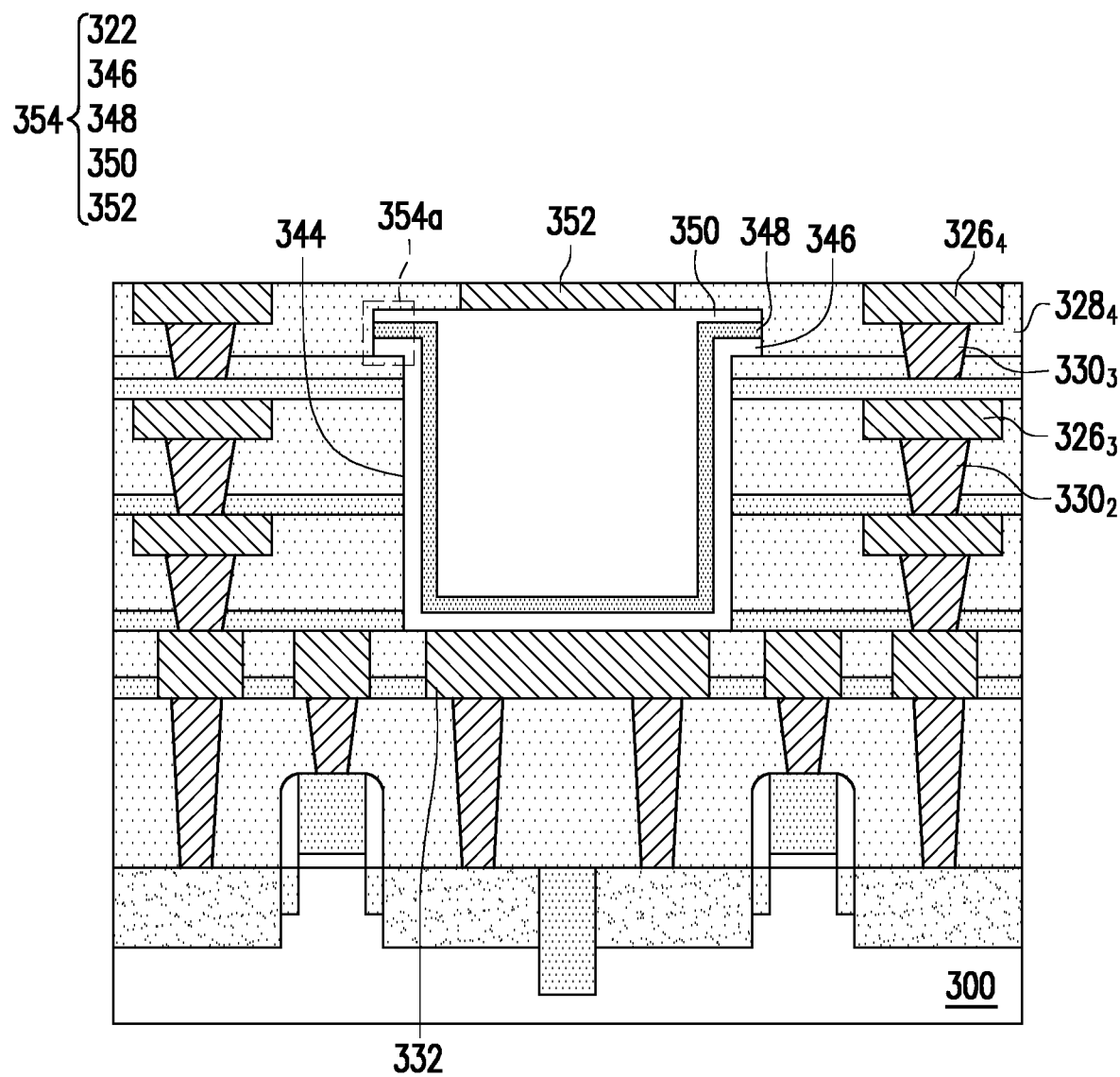

Next, referring to FIG. 3G, the second electrode layer 350, the dielectric layer 348, and the first electrode layer 346 are patterned, and then an upper metal layer 352 is formed on the second electrode layer 350 to complete the manufacture of the capacitor 354. The upper metal layer 352 may be manufactured together with the m-th metal layer $326_N$ (wherein m≥n+1). FIG. 3G shows that the upper metal layer 352 is manufactured together with the fourth metal layer 3264, so the upper metal layer 352 is a portion of the fourth metal layer 3264. In other words, the second electrode layer 350 may be first covered with the ILD layer 3284, and the via 3303 and the metal layer 3264 may be formed therein, and the upper metal layer 352 may be simultaneously formed during the forming of the metal layer 3264. In addition, in the patterning step, a portion of the second electrode layer 350, a portion of the dielectric layer 348, and a portion of the first electrode layer 346 outside the opening 344 may be kept to form an extending portion 354a of the capacitor 354 to further increase capacitance.

Based on the above, in the invention, the original 2T-SRAM process is integrated to form the capacitor in the metal interconnect structure. Therefore, the height thereof is significantly greater than the surface area of the capacitor traditionally formed on the substrate and close to the thickness of the inner dielectric layer, thereby increasing capacitance. Moreover, since the coupling between the capacitor and the two transistors is done via the lower metal layer, the process conditions of the invention are more relaxed compared to the traditional capacitor process directly in contact with the source node. At the same time, because the position of the capacitor is moved up to the metal interconnect structure, there is room for metal word lines connected to the gate, thereby reducing the impedance of traditionally using polysilicon as the word lines. As a result, the probability of shifting to the power supply capacity of the gate may be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a static random-access memory device, comprising:
   providing a substrate;
   forming a first transistor and a second transistor on the substrate, wherein the first transistor comprises a first gate, a first source node, and a first drain node, and the second transistor comprises a second gate, a second source node, and a second drain node;
   forming an inner dielectric layer covering the first transistor and the second transistor;
   forming a plurality of contacts coupled to the first source node and the second source node in the inner dielectric layer;
   forming a metal interconnect structure on the inner dielectric layer, wherein the metal interconnect structure comprises a plurality of metal layers, a plurality of interlayer dielectric (ILD) layers, and a plurality of vias connected to different layers of the plurality of metal layers, wherein a portion of an n-th metal layer of the plurality of metal layers is utilized as a lower metal layer, wherein n≥1;
   forming an opening in the metal interconnect structure, wherein a bottom of the opening exposes the lower metal layer; and
   forming a capacitor in the opening, wherein the capacitor comprises the lower metal layer, a first electrode layer formed at a surface of the opening, a dielectric layer formed at a surface of the first electrode layer, a second electrode layer completely filling the opening and covering the dielectric layer, and an upper metal layer formed at a surface of the second electrode layer, and the upper metal layer is a portion of an m-th metal layer of the plurality of metal layers, wherein m≥n+1.

2. The manufacturing method of the static random-access memory device of claim 1, wherein the step of forming the opening comprises:
   forming a plurality of mask layers above the metal interconnect structure;

forming a patterned photoresist layer on the plurality of mask layers, wherein the patterned photoresist layer has a pattern aligned with the lower metal layer;

transferring the pattern to the plurality of mask layers using the patterned photoresist layer as a mask;

transferring the pattern to the metal interconnect structure using the plurality of mask layers as a mask; and removing the patterned photoresist layer and the plurality of mask layers.

3. The manufacturing method of the static random-access memory device of claim 1, wherein a method of forming the first electrode layer comprises metal-organic vapor deposition (MOCVD).

4. The manufacturing method of the static random-access memory device of claim 1, wherein a material of the dielectric layer comprises a high-k material.

5. The manufacturing method of the static random-access memory device of claim 1, wherein a method of forming the second electrode layer comprises supercritical fluid deposition (SFD), physical vapor deposition (PVD), or a combination thereof.

6. The manufacturing method of the static random-access memory device of claim 1, wherein the step of forming the capacitor comprises:

depositing the first electrode layer, the dielectric layer, and the second electrode layer in sequence on the metal interconnect structure and the lower metal layer in the opening;

patterning the second electrode layer, the dielectric layer, and the first electrode layer; and forming the upper metal layer on the second electrode layer.

7. The manufacturing method of the static random-access memory of claim 6, wherein the step of patterning the second electrode layer, the dielectric layer, and the first electrode layer comprises keeping a portion of the second electrode layer, the dielectric layer, and the first electrode layer outside the opening to form an extending portion of the capacitor.

\* \* \* \* \*